United States Patent [19]

Kata et al.

[11] Patent Number: 5,759,873
[45] Date of Patent: Jun. 2, 1998

[54] METHOD OF MANUFACTURING CHIP-SIZE PACKAGE-TYPE SEMICONDUCTOR DEVICE

[75] Inventors: Keiichiro Kata; Shuichi Matsuda; Hironori Ono, all of Tokyo, Japan

[73] Assignee: NEC Corporation, Japan

[21] Appl. No.: 733,207

[22] Filed: Oct. 17, 1996

[30] Foreign Application Priority Data

Oct. 19, 1995 [JP] Japan .................................. 7-271449

[51] Int. Cl.$^6$ .......................... H01L 21/44; H01L 21/48; H01L 21/50
[52] U.S. Cl. .................. 438/118; 438/119; 438/125; 438/401; 438/462; 29/25.01
[58] Field of Search ........................ 438/118, 119, 438/125, 401, 462, 611; 29/25.01; 83/531

[56] References Cited

U.S. PATENT DOCUMENTS 4,740,136  4/1988  Asai et al. ............................ 414/787
4,829,663  5/1989  Masujima et al. ....................... 29/840

*Primary Examiner*—John Niebling
*Assistant Examiner*—David A. Zarneke
*Attorney, Agent, or Firm*—Hayes, Soloway, Hennessey, Grossman & Hage, P.C.

[57] ABSTRACT

In a method of manufacturing a chip size semiconductor device comprising a semiconductor chip and a carrier tape including an insulating film and wiring patterns formed on one surface of the insulating film, the method comprises the steps of bonding the semiconductor chip and the carrier tape by the use of an adhesive film having a predetermined size corresponding to an adhesive area of the semiconductor chip. The step of bonding comprises the substeps of cutting away the adhesive film by punching from an adhesive film tape held above the semiconductor chip mounted on a table and subsequently setting the adhesive film on the adhesive area by moving the adhesive film downwardly.

7 Claims, 12 Drawing Sheets

5,759,873

METHOD OF MANUFACTURING CHIP-SIZE PACKAGE-TYPE SEMICONDUCTOR DEVICE

BACKGROUND OF THE INVENTION

The present invention relates to a method of manufacturing a semiconductor device and, more specifically, to a method of manufacturing a semiconductor device, called a chip-size package, which is suitable for high-density packaging.

Various types of semiconductor devices have been developed for satisfying demands to electronic devices, such as, reduction in size and weight, speed-up and multi-functionalization thereof. Demands for increasing the number of pins due to the high integration of the semiconductor chips and for reduction in size and thickness of the semiconductor devices have been getting stronger so that the fine-pitch arrangement of the pins is essential for satisfying both demands. Thus, it is considered that the inner-lead connection which can narrow pitches of the pins and the area-array connection which can enlarge pitches of the pins, be the essential techniques.

A chip-size package-type semiconductor device is in the form of a semiconductor chip and a carrier tape which are integrally bonded by means of an adhesive film. One side of the semiconductor chip, which is attached to the carrier tape, is formed with a plurality of electrode pads along the edge thereof. On the other hand, the carrier tape includes an organic insulating film and wiring layers formed on one surface of the organic insulating film. Each of the wiring layers includes a region for connection to the corresponding electrode pad of the semiconductor chip. Further, a plurality of bump electrodes are formed as electrode pads of the carrier tape for connection to the exterior. The bump electrodes are arranged in a grid at regular pitches and distributed widely on a side of the organic insulating film remote from the wiring layers. The wiring layers are provided on a side of the carrier tape facing the semiconductor chip. Each of the wiring layers has one end connected to the corresponding bump electrode through a via hole which is formed by filling a metal material into a through hole formed at the organic insulating film. Other through holes are further formed at the carrier tape, and the metal material is filled into these other through holes so as to form via holes, each for connection between the wiring layer and the electrode pad as inner leads. Each via hole is adjustable in position, when formed, relative to the electrode pad and the wiring layer. The inner-lead connection of the electrode pad and the wiring layer is achieved through this via hole.

The chip-size package-type semiconductor device is, in general, fabricated in the following manner.

An adhesive film is cut away from an adhesive film tape by punching. After temporarily attaching the adhesive film to either one of the semiconductor chip and the carrier tape, the electrode pads and the wiring layers are electrically connected to each other. Subsequently, the adhesive film is bonded to the other of the semiconductor chip and the carrier tape by applying heat and pressure. Thus, a size of the adhesive film is limited to a size corresponding to an area defined within the electrode pads, that is, not corresponding to all the area of the joint surface of the semiconductor chip, so as to avoid overlapping the electrode pads.

However, in such a fabricating method, setting or positioning of the adhesive film relative to the semiconductor chip is difficult. This is because the adhesive film is small in size and thin in thickness and therefore has a tendency to deform and a deteriorated handling performance.

Generally, the semiconductor chip is molded by resin material in a manner called a transfer molding method after bonding the semiconductor chip and the carrier tape. In the transfer molding method, it requires a die assembly high in cost and accuracy. Moreover, if the size of the semiconductor chip is changed, another die assembly must be provided. This causes up of a manufacturing cost.

Further, an unnecessary portion is cut away from the carrier tape with a die. Namely, the carrier tape is cut by the same size as that of the semiconductor chip. This means that another die must be provided, if the size of the semiconductor chip is changed.

SUMMARY OF THE INVENTION

It is therefore an object of this invention to provide a method of manufacturing a chip size semiconductor device which is capable of simplifying a bonding step for a semiconductor chip and a carrier tape.

It is another object of this invention to provide the method of manufacturing the chip size semiconductor device which is capable of molding the semiconductor chip without a die assembly.

It is further object of this invention to provide the method of manufacturing the chip size semiconductor device which is capable of dealing with change of a size of the semiconductor chip with ease.

According to one aspect of the present invention, a method of manufacturing a chip size semiconductor device comprises a semiconductor chip and a carrier tape including an insulating film and wiring patterns formed on one surface of the insulating film. The method comprises the steps of bonding the semiconductor chip and the carrier tape by the use of an adhesive film having a predetermined size corresponding to an adhesive area of the semiconductor chip. The adhesive film bonds the semiconductor chip and the carrier tape by heating. The method further comprises the steps of molding the semiconductor chip by resin material, and cutting unnecessary portion of the carrier tape. The step of bonding comprises the substeps of cutting away the adhesive film by punching from an adhesive film tape held above the semiconductor chip mounted on a table and subsequently setting the adhesive film on the adhesive area by moving the adhesive film downwardly.

BRIEF DESCRIPTION OF THE DRAWING

The present invention will be understood more fully from the detailed description given hereinbelow, taken in conjunction with the accompanying drawings.

In the drawings.

DESCRIPTION OF THE PREFERRED EMBODIMENT

In order to facilitate an understanding of this invention, a conventional method of manufacturing a chip-size package-type semiconductor device will first be explained hereinbelow with reference to FIGS. 1 and 2.

Figure 1:
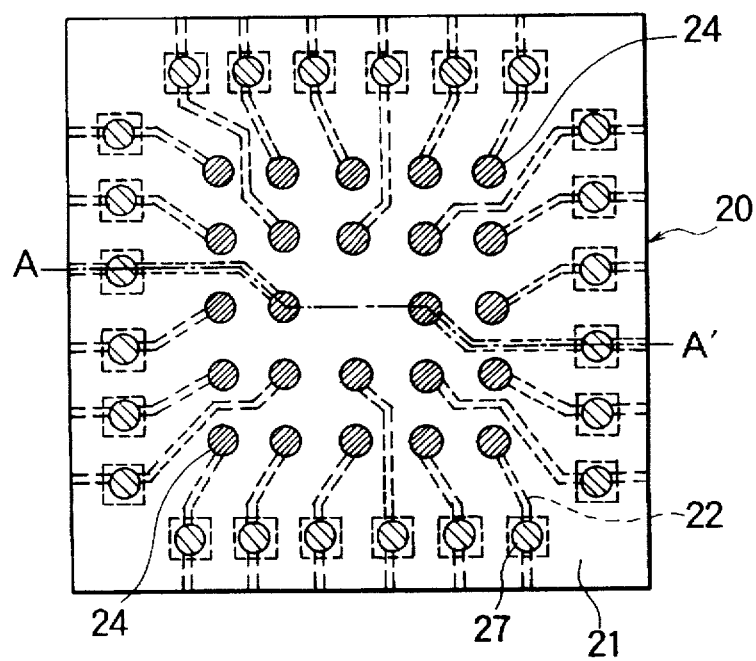
FIG. 1 is a plan view, seen from a carrier tape side, of a conventional semiconductor device.
Figure 2:
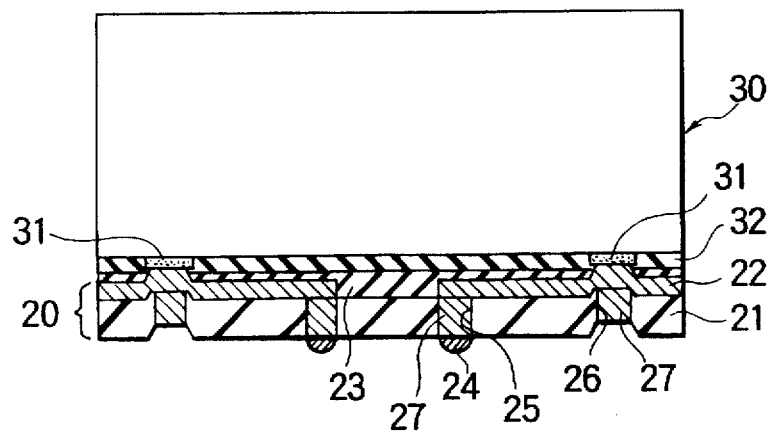
FIG. 2 is a sectional view taken along line A-A' in FIG. 1.

In FIGS. 1 and 2, the semiconductor device includes a carrier tape 20 having an organic insulating film 21 and wiring layers 22 formed on the organic insulating film 21. A material of the organic insulating film 21 may be polyimide resin or the like. The wiring layers 22 are formed by processing, such as etching, a metal foil of copper or the like into desired shapes. Each wiring layer 22 is formed with a region for connection to a corresponding electrode pad 31 of a semiconductor chip 30.

The semiconductor chip 30, although its internal structure is not shown, has a surface bonded to the carrier tape 20. On this surface, a plurality of the electrode pads 31 are formed along the edge thereof, and further, a passivation film 32 is formed except at the regions of the electrode pads 31. The semiconductor chip 30 and the carrier tape 20 are bonded together by means of an adhesive film 23. Further, a plurality of bump electrodes 24 are formed as electrode pads of the carrier tape 20 for connection to the exterior. A material of the bump electrode 24 may be solder or the like. As shown in FIG. 1, the bump electrodes 24 are arranged in a grid at regular pitches and distributed widely on a side of the organic insulating film 21 remote from the wiring layers 22. The wiring layers 22 are provided on a side of the carrier tape 20 facing the semiconductor chip 30. Each of the wiring layers 22 has one end connected to the corresponding bump electrode 24 through a via hole which is formed by filling a metal material 27 into a through hole 25.

Through holes 26 are further formed at the carrier tape 20, and the metal material 27 is filled into the through holes 26 so as to form via holes, each for connection between the wiring layer 22 and the electrode pad 31 as inner leads. Each via hole is adjustable in position, when formed, relative to the electrode pad 31 and the wiring layer 22. The inner-lead connection of the electrode pad 31 and the wiring layer 22 is achieved through this via hole.

The manufacturing method of the semiconductor device will be explained hereinbelow with reference to FIGS. 3A to 3G.

Figure 3A:
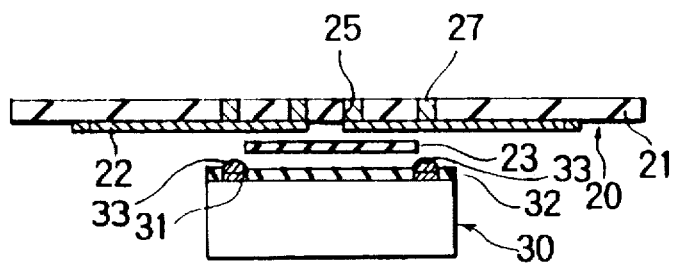
FIGS. 3A to 3G are diagrams showing fabricating processes of the semiconductor device shown in FIGS. 1 and 2.

As shown in FIG. 3A, the carrier tape 20, the adhesive film 23 and the semiconductor chip 30 are necessary for constituting the semiconductor device. Although it is not illustrated in FIG. 2, ball bumps 33 of gold are formed on the electrode pads 31.

Figure 4:
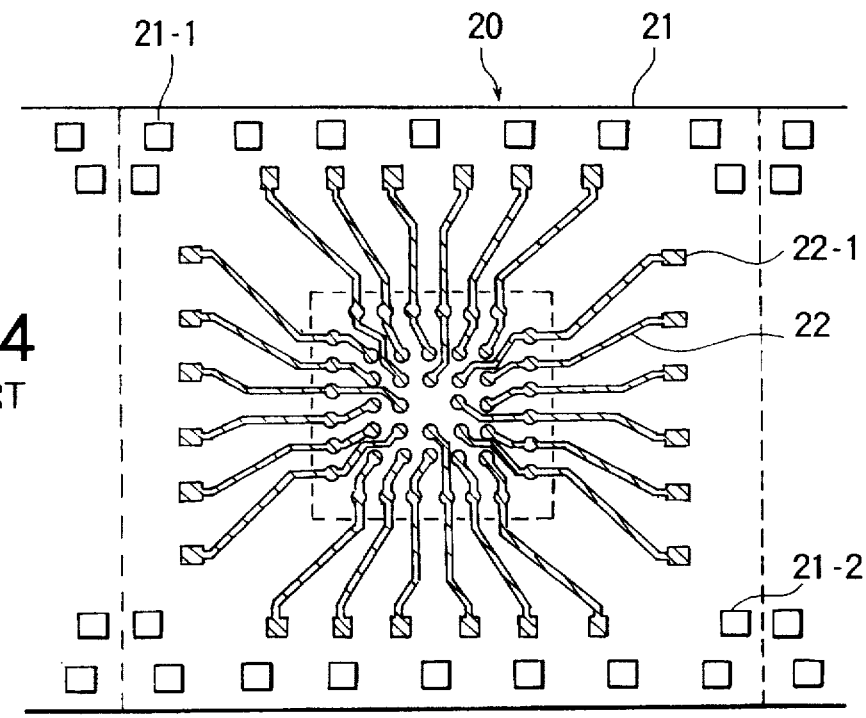
FIG. 4 is a plan view, seen from a side facing a semiconductor chip, of the carrier tape shown in FIGS. 1 and 2.
Figure 5:
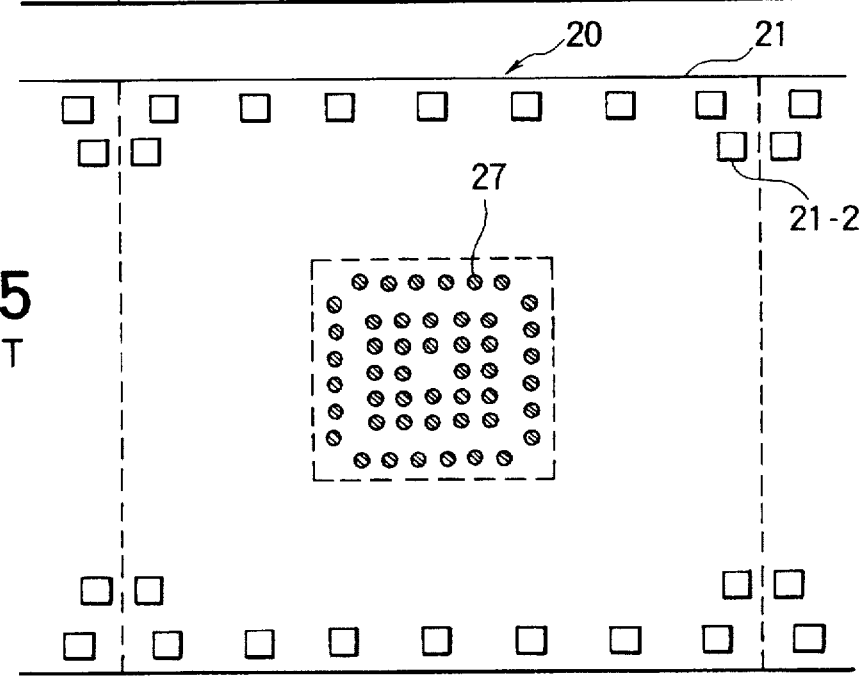
FIG. 5 is a plan view, seen from a side opposite to FIG. 4, of the carrier tape shown in FIGS. 1 and 2.

The carrier tape 20 is shown in FIGS. 4 and 5. FIG. 4 shows the carrier tape 20 at a side of the wiring layers 22, that is, at a side facing the semiconductor chip 30. On the other hand, FIG. 5 shows an opposite side of the carrier tape 20. The carrier tape 20 is produced, for example, according to the following method:

First, a two-layer base member in the form of the polyimide organic insulating film 21 and the metal foil of copper or the like is prepared. The organic insulating film 21 has sprocket holes 21-1 formed beforehand in any appropriate manner such as punching. Using the photoresist method, the wiring layers 22 of desired shapes are formed on the two-layer base member so as to be properly positioned for connection to the electrode pads 31 of the semiconductor chip 30 through the ball bumps 33. As described before, each of the wiring layers 22 is connected to the metal material 27 at its one end. On the other hand, the other end thereof is connected to an electric-selection pad 22-1. Subsequently, the through holes 25 and 26 are formed at the organic insulating film 21 by etching, laser processing or the like as mentioned in conjunction with FIG. 2.

Thereafter, the metal material 27 is filled into the through holes 25 and 26 by the electrolytic plating or the like for connection to the wiring layers 22. Finally, the organic insulating film 21 is etched so as to form positioning holes 21-2.

Figure 3B:
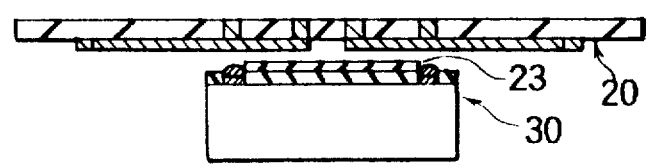
Figure 3C:
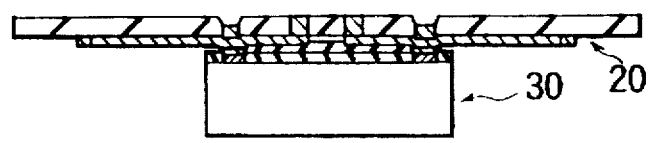

Referring to FIG. 3B, the adhesive film 23 is set on the semiconductor chip 30. Subsequently, in FIG. 3C, the single-point bonder, which is used for the TAB connection, is used so as to achieve the foregoing inner-lead connection after properly positioning between the carrier tape 20 and the semiconductor chip 30 temporarily fixed with the adhesive film 23.

Figure 3D:
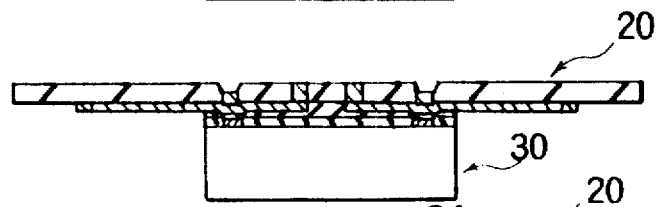

Subsequently, in FIG. 3D, for bonding together the carrier tape 20 and the semiconductor chip 30 with the adhesive film 23 sandwiched therebetween, heat and pressure are applied for several seconds from a side of the carrier tape 20 or the semiconductor chip 30. At this time, bump electrodes 24 are formed on a side of the carrier tape 20 facing an external board, in a grid at the same pitch.

Figure 3E:
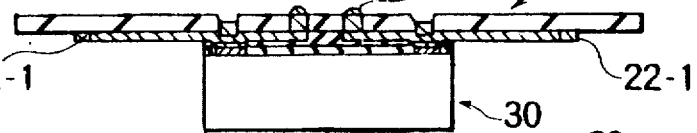

Subsequently, in FIG. 3E, the electric selection (BT) is performed in the same manner as in the normal tape carrier package (TCP), using the electric-selection pads 22-1.

Figure 3F:
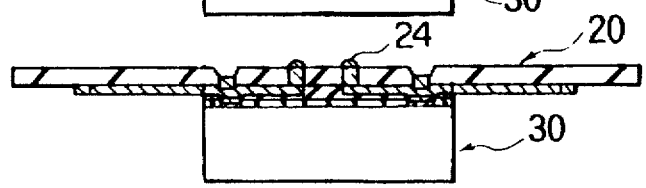
Figure 3G:
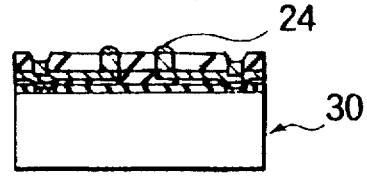

Subsequently, in FIG. 3F, after indicating an article name, using a laser beam, on a side of the semiconductor chip 30 remote from the carrier tape 20, the die or laser is used to cut unnecessary portions of the semiconductor device. As a result, the chip-size package-type semiconductor device can be obtained as shown in FIG. 3G.

As appreciated from the foregoing description, the chip-size package-type semiconductor device has been, in general, fabricated in the following manner:

After temporarily attaching the adhesive film 23 to either one of the semiconductor chip 30 and the carrier tape 20, the electrode pads 31 and the wiring layers 22 are electrically connected to each other. Subsequently, the adhesive film 23 is bonded to the other of the semiconductor chip 30 and the carrier tape 20 by applying heat and pressure. Accordingly, as shown in FIGS. 3A to 3G, a size of the adhesive film 23 is limited to a size corresponding to an area defined within the electrode pads 31, that is, not corresponding to all the area of the joint surface of the semiconductor chip 30, so as to avoid overlapping the electrode pads 31.

Figure 6:
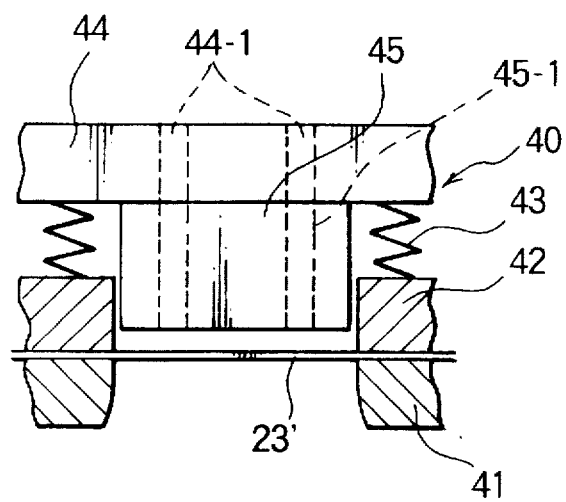
FIG. 6 is an illustration for explaining a conventional die assembly for use in cutting an adhesive film.
Figure 7:
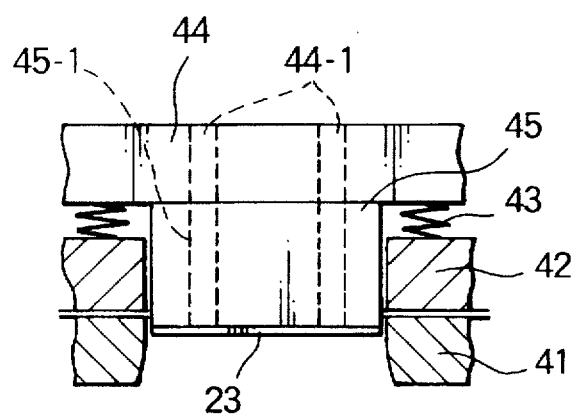
FIG. 7 is an illustration for explaining a cut process by the die assembly illustrated in FIG. 6.

Referring to FIGS. 6 and 7, an adhesive film tape 23' is cut into the adhesive film 23 having a required size by the use of a die assembly 40. The die assembly 40 comprises a die 41 and a hold-down member 42 for holding the adhesive film tape 23' onto the die 41. The hold-down member 42 is pressurized through a spring member 43 by an upper die 44 which is moved upwardly and downwardly by a die drive unit (not shown). A punch 45 is attached to an under surface of the upper die 44 in order to cut the adhesive film tape 23' in cooperation with the die 41. The punch 45 has a sectional size which is equal to the required size of the adhesive film 23. The upper die 44 and the punch 45 have a plurality of through holes 44-1 and 45-1, respectively, which are connected to each other. The through holes 44-1 and 45-1 are for separating the adhesive film 23 from an under surface of the punch 45 by blowing pressurized air. This is because the adhesive film 23 cut away from the adhesive film tape 23' adheres to the under surface of the punch 45. For this purpose, inlet sides of the through holes 44-1 are connected to a pressurized air supply unit (not shown).

As shown in FIG. 7, when the upper die 44 is moved downwardly, the adhesive film tape 23' is held by the hold-down member 42. Subsequently, the punch 45 cuts the adhesive film tape 23' into the adhesive film 23.

Figure 8:
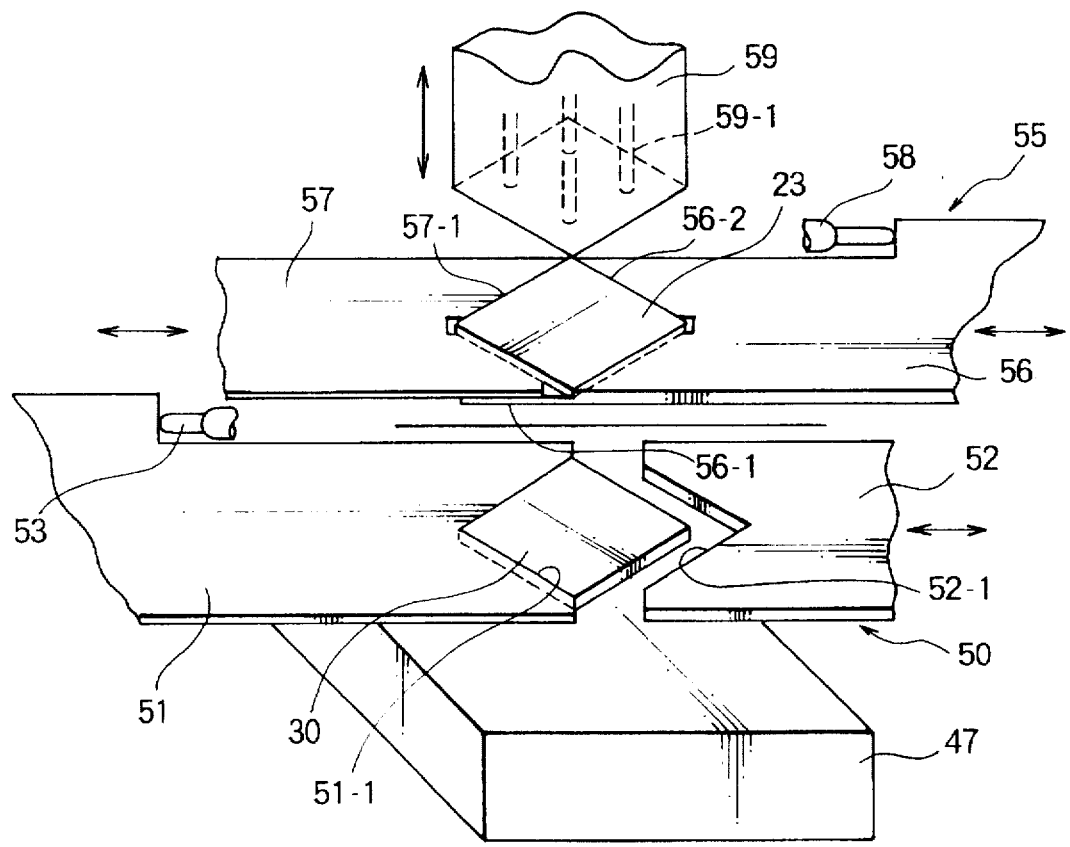
FIG. 8 is an illustration for explaining a setting step which is for setting the adhesive film onto the semiconductor chip.

Referring to FIG. 8, the semiconductor chip 30 is set onto a heating block 47 by the use of a chip positioning unit 50. By the use of a film positioning unit 55 and a transfer head 59, the adhesive film 23 is set onto the semiconductor chip 30 set on the heating block 47. The chip positioning unit 50 comprises chuck plate members 51 and 52 having chuck portions 51-1 and 52-1, respectively. The chuck plate member 51 is moved by a micrometer head 53. Similarly, the chuck plate member 52 is moved by another micrometer head (not shown). Thus, the chuck portions 51-1 and 52-1 move so as to approach and separate from each other.

The film positioning unit 55 comprises positioning plate members 56 and 57. The positioning plate member 56 has a mount portion 56-1 for mounting the adhesive film 23 and a positioning portion 56-2 for determining the position of a half of the adhesive film 23. The positioning plate member 57 has a positioning portion 57-2 for determining the position of another half of the adhesive film 23. The positioning plate member 56 is moved by a micrometer head 58. Similarly, the positioning plate member 57 is moved by another micrometer head (not shown). Thus, the positioning portions 56-2 and 57-1 move so as to approach and separate from each other.

The transfer head 59 is for transferring the adhesive film 23 from the film positioning unit 55 to the chip positioning unit 50. The transfer head 59 has an air chuck for holding the adhesive film 23 at an under surface thereof by the use of vacuum air. For this purpose, the transfer head 59 has a plurality of through holes 59-1 extending to the under surface of the transfer head 59. Other ends of the through holes 59-1 are connected to an air vacuum unit (not shown).

The adhesive film 23 is set onto the semiconductor chip 30 in the manner mentioned hereinunder. At first, a center positioning operation between the semiconductor chip 30 and the transfer head 59 is carried out over the heating block 47 by moving the positioning plate members 51 and 52 in a state that the positioning plate members 51 and 52 chuck the semiconductor chip 30. Next, a center positioning operation between the adhesive film 23 and the transfer head 59 is carried out over the semiconductor chip 30 by moving the positioning plate members 56 and 57 in a state that the adhesive film 23 is positioned by the positioning portions 56-2 and 57-1. Then, the transfer head 59 is moved downwardly and holds the adhesive film 23 at the under surface thereof by the vacuum air. The transfer head 59 is temporarily moved upwardly. At this time, the positioning plate members 56 and 57 are moved so as to separate from each other. The transfer head 59 is moved downwardly through a space between the positioning plate members 56 and 57 and is stopped at the position that the adhesive film 23 comes into contact with the semiconductor chip 30. Subsequently, the transfer head 59 releases the adhesive film 23 by stopping the vacuum air. The transfer head 59 is moved upwardly and then the adhesive film 23 is heated by the heating block 47. When the adhesive film 23 melts, the carrier tape is transferred over the semiconductor chip 30 by another transfer unit (not shown). Then, the bonding step is carried out as described in conjunction with FIG. 3C.

Figure 9:
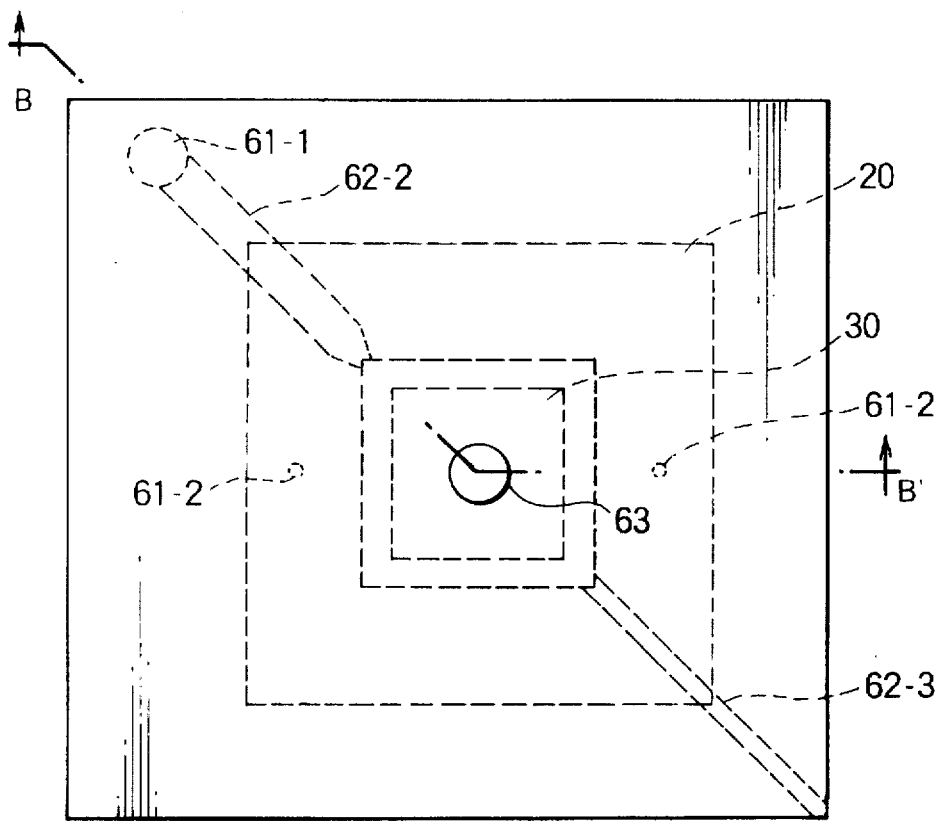
FIG. 9 is a plan view for explaining a conventional die unit for molding the semiconductor chip by resin material.
Figure 10:
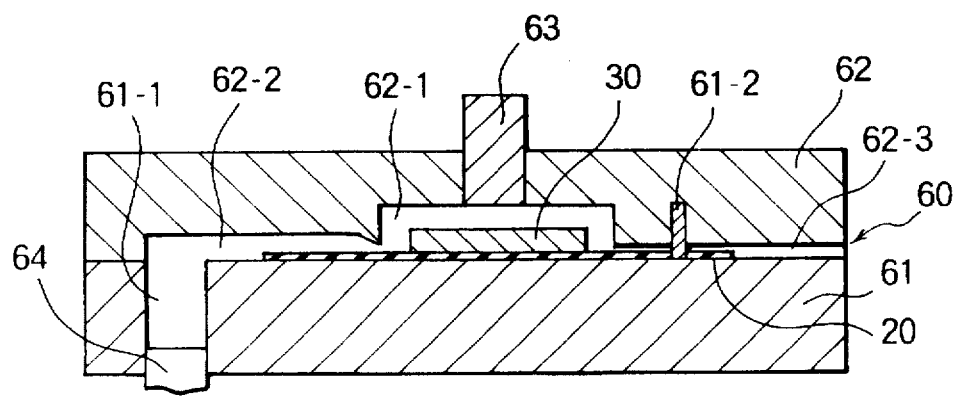
FIG. 10 is a sectional view taken along line B-B' in FIG. 9.

Referring to FIGS. 9 and 10, the semiconductor chip 30 is molded by resin material by the use of a die unit 60. The die unit 60 comprises a lower side die 61 and an upper side die 62. The lower side die 61 has an injection hole 61-1 extending from an under surface to an upper surface for injecting melted resin material. In order for positioning of the upper die 62, two positioning pins 61-2 are attached onto the upper surface of the lower die 61. The upper die 62 has a cavity portion 62-1 at a center area of an under surface thereof and a guide path 62-2 for connecting between the injection hole 61-1 and the cavity portion 62-1. The upper die 62 further has an air vent 62-3 extending from the cavity portion 62-1 to an external area. A release pin 63 is inserted into the upper die 62 at a center portion thereof in order for releasing the lower die 61 from the upper die 62 after completion of the molding step.

The molding step is carried out in a manner mentioned hereinunder. At first, the melted resin material is injected through the injection hole 61-1 and guide path 62-2 into the cavity portion 62-1 that holds the semiconductor chip 30 bonded with the carrier tape 20. It should be noted here that the carrier tape 20 is on the lower die 61 in order to mold the semiconductor chip 30 only. A plunger piston 64 is inserted into the injection hole 61-1 under pressurization. As a result, the melted resin material is filled into the cavity portion 62-1. When the resin material solidified, the upper die 62 releases from the lower die 61 by the use of the release pin 63. Then, the carrier tape 20 releases from the lower die 61 together with the semiconductor chip 30. Thus, it is possible to obtain the semiconductor chip 30 that is molded on the carrier tape 20 by the resin material. Such the semiconductor chip 30 will be called a package hereinafter.

Figure 11:
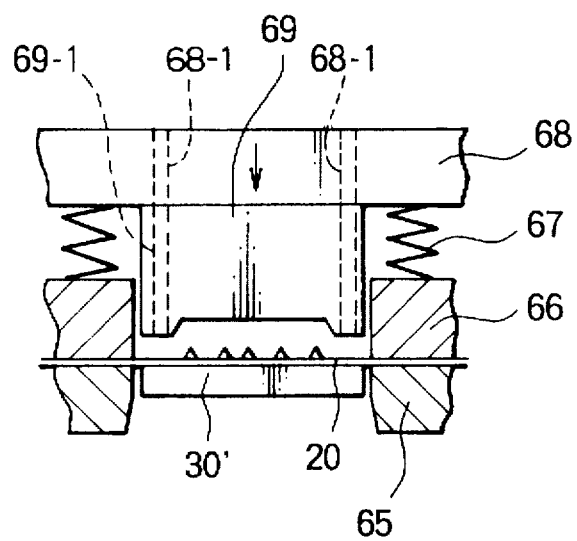
FIG. 11 is an illustration for explaining a conventional die assembly for use in cutting a carrier tape.
Figure 12:
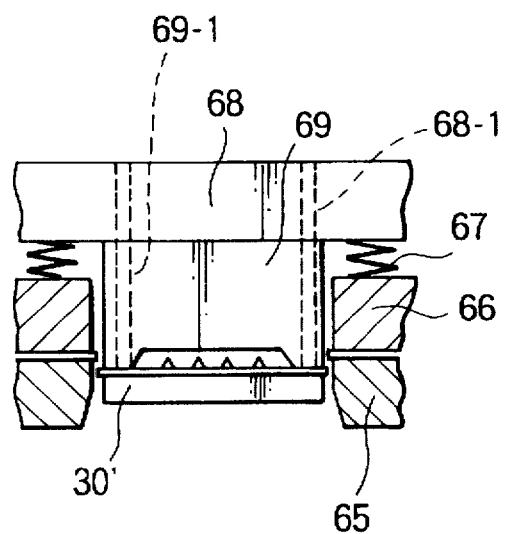
FIG. 12 is an illustration for explaining a cut process by the use of the die assembly illustrated in FIG. 11.

Referring to FIGS. 11 and 12, the description will be made with regard to the cutting step of the carrier tape 20. The cutting step is carried out by a cut die assembly similar to that described in conjunction with FIGS. 6 and 7. The cut die assembly comprises a die 65 and a hold-down member 66 for holding the carrier tape 20 onto the die 65. The hold-down member 66 is pressurized through a spring member 67 by an upper die 68 which is moved upwardly and downwardly by a die drive unit (not shown). A punch 69 is attached to an under surface of the upper die 68 in order to cut the carrier tape 20 in cooperation with the die 65. The punch 69 has a sectional size which is equal to an outline of the semiconductor chip 30 molded by the resin material. The upper die 68 and the punch 69 have a plurality of through holes 68-1 and 69-1, respectively, which are connected to each other. The through holes 68-1 and 69-1 are for holding a package 30' at an under surface of the punch 69 by vacuum air. For this purpose, inlet sides of the through holes 68-1 are connected to an air vacuum unit (not shown).

As shown in FIG. 12, when the upper die 68 is moved downwardly, the carrier tape 20 is held by the hold-down member 66. Subsequently, the punch 69 cuts unnecessary portion of the carrier tape 20. The punch 69 holds the package 30' by the vacuum air.

Turning back to FIG. 8, setting or positioning of the adhesive film 23 relative to the semiconductor chip 30 is difficult. This is because the adhesive film 23 is small in size and thin in thickness and therefore has a tendency to deform and a deteriorated handling performance.

In the molding step described in conjunction with FIGS. 9 and 10, it requires the die unit 60 which is expensive and which requires high accuracy. Further, if the size of the semiconductor chip 30 is changed, another die unit must be provided.

In the cutting step of the carrier tape 20 mentioned in conjunction with FIGS. 11 and 12, it requires the die assembly which fits the package 30' in size. This means that another die assembly must be provided, if the size of the semiconductor chip 30 is changed.

Figure 13:
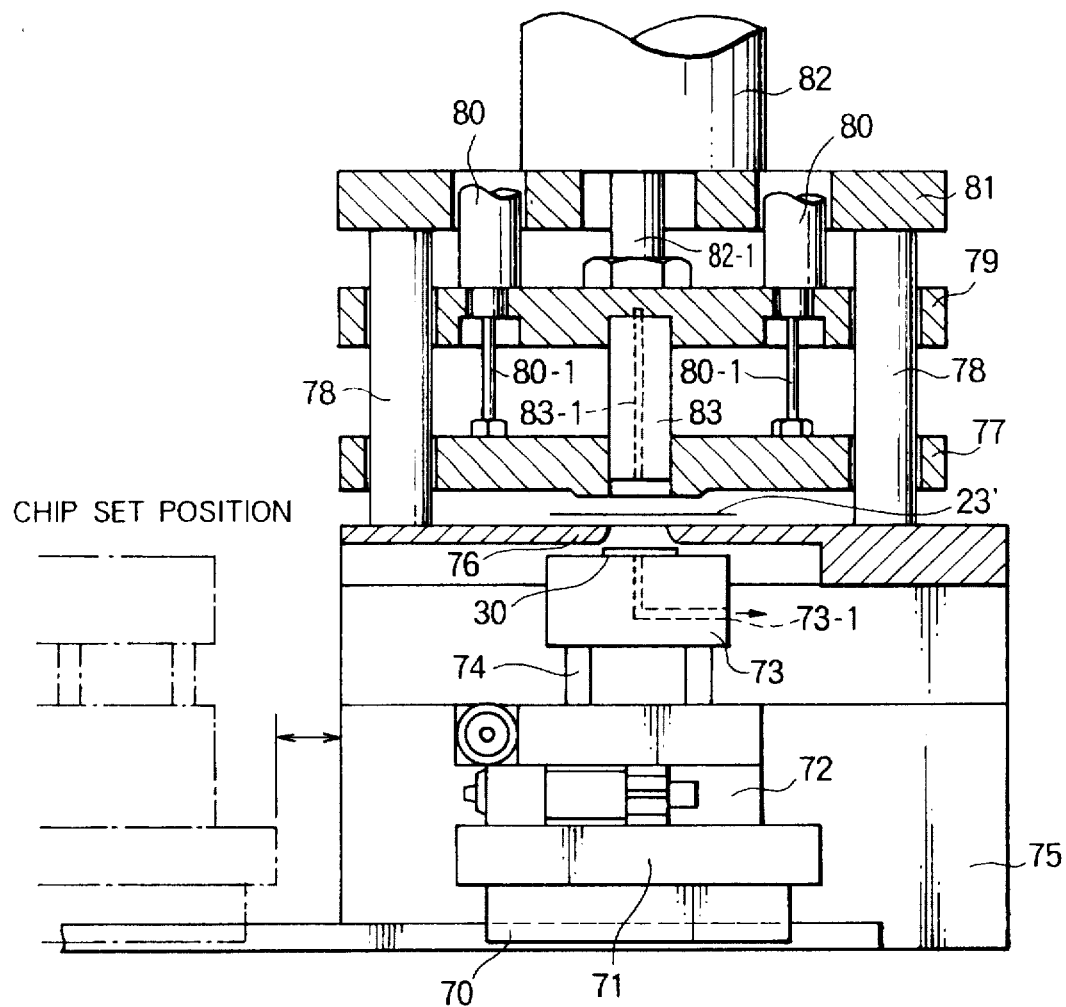
FIG. 13 shows a device for use in bonding a semiconductor chip and a carrier tape according to this invention.

Referring to FIG. 13, the description will be made with regard to a method of manufacturing a chip-size package-type semiconductor device according to the present invention. At first, a cutting and setting step of the adhesive film will be described. The cutting and setting step is carried out by a device illustrated in FIG. 13 before bonding of the carrier tape and the semiconductor chip.

In FIG. 13, the device comprises a transfer plate 70 which is for moving a θ-axis table 71. The transfer plate 70 is moved between a chip set position depicted at a chain line and a film set position that is illustrated by a real line. An X-Y table 72 is mounted on the θ-axis table 71. In the example, the θ axis means a vertical axis. The θ-axis may be called a Z-axis. The θ-axis table 71 is for horizontarily rotating the X-Y table 72 around a center axis thereof. The θ-axis table 71 has an X-Y plane defined by an X-axis and a Y-axis. The X-Y table 72 is movable with respect to the X-axis and the Y-axis on the θ-axis table 71. A heating block 73 is mounted on the X-Y table 72 through a support member 74. The heating block 73 comprises a heater and an air chuck mechanism for holding the semiconductor chip 30 by vacuum air. For this purpose, the heating block 73 has a through hole 73-1 which is connected to an air vacuum unit (not shown).

An assembly comprised of the θ-axis table 71, the X-Y table 72, the heating block 73 is contained movably in a support frame 75. At an upper side of the support frame 75, namely, over the heating block 73, a die 76 is formed. The die 76 serves as a table for supporting the adhesive film tape 23' of a sheet-shape. Over the die 76, a hold-down plate 77 is installed via guide members 78. The hold-down plate 77 is slidable upwardly and downwardly along the guide members 78. The adhesive film tape 23' is held on the die 76 by the hold-down plate 77 slid downwardly. An up-down plate 79 is combined with the hold-down plate 77 and is slidable upwardly and downwardly along the guide members 78. The up-down plate 79 is provided with a pair of first air cylinder mechanisms 80. Driving shafts 80-1 of the first air cylinder mechanisms 80 are fixed to the hold-down plate 77. A support plate 81 is attached to upper ends of the guide members 78. The support plate 81 is provided with a second air cylinder mechanism 82. A driving shaft 82-1 of the second air cylinder mechanism 82 is fixed to the up-down plate 79. The up-down plate 79 is further provided with a punch 83 at a lower side and a center portion thereof. The punch 83 has a sectional size which is equal to a required size of the adhesive film. The punch 83 extends downwardly and passes through a center portion of the hold-down plate 77. Accordingly, the punch 83 moves together with the up-down plate 79. The punch 83 comprises an air chuck mechanism for holding the adhesive film cut away from the adhesive film tape 23' by the vacuum air. For this purpose, the punch 83 has a through hole 83-1 connected to a vacuum air unit (not shown). It is desirable that the under surface of the punch 83 is treated by coating such as teflon coating, TiN coating, or the like, in order to improve separation characteristic between the adhesive film and the punch 83.

In such a structure, when the second air cylinder mechanism 82 is driven, the hold-down plate 77 moves up and down together with the up-down plate 79. When the first air cylinder mechanisms 80 are driven, only the hold-down plate 77 moves up and down. The adhesive film tape 23' is fed by a tape feed unit (not shown) in a vertical direction on a surface of the drawing. The adhesive film tape 23' may be rolled in a roll-shape.

At first, the transfer plate 70 is positioned at the chip set position. At this position, the semiconductor chip 30 is set onto the heating block 73. The semiconductor chip 30 is held by the air chuck mechanism of the heating block 73. Then, the transfer plate 70 moves from the chip set position to the film set position. By driving the θ-axis table 71 and the X-Y axis table 72, the semiconductor chip 30 is positioned so that the semiconductor chip 30 is present just under an opening of the die 76 and that a center of the semiconductor chip 30 is coincident with a center of the punch 83. The adhesive film tape 23' is held on the upper surface of the die 76 by the hold-down plate 77. In this state, the punch 83 is moved downwardly and cuts the adhesive film away from the adhesive film tape 23'. The punch 83 holds the adhesive film cut away from the adhesive film tape 23' at the under surface thereof by the vacuum air and continues downward movement. When the adhesive film comes into contact with the upper surface of the semiconductor chip 30, the downward movement of the punch 83 is stopped. At this time, a driving force of the second air cylinder mechanism 82 is reduced by reducing an air pressure thereof. Subsequently, the punch 83 releases the adhesive film by stopping the vacuum air. Thus, the adhesive film is set onto the semiconductor chip 30.

Next, the adhesive film is melted by the heating block 73. As a result, the adhesive film temporarily adheres to the semiconductor chip 30. Then, the semiconductor chip 30 is transferred to another device and is bonded to the carrier tape in the manner mentioned in conjunction with FIG. 3.

As apparent from the above description, since the adhesive film tape 23' is treated in the form of the tape-shape or the roll-shape, handling becomes easy. Further, since the punch 83 carries out the punching and the holding of the adhesive film, the adhesive film is held by the punch 83 without deviation of position. This means that the adhesive film is set onto the semiconductor chip in high accuracy by carrying out only the positioning of the semiconductor chip against the punch 83.

Figure 14:
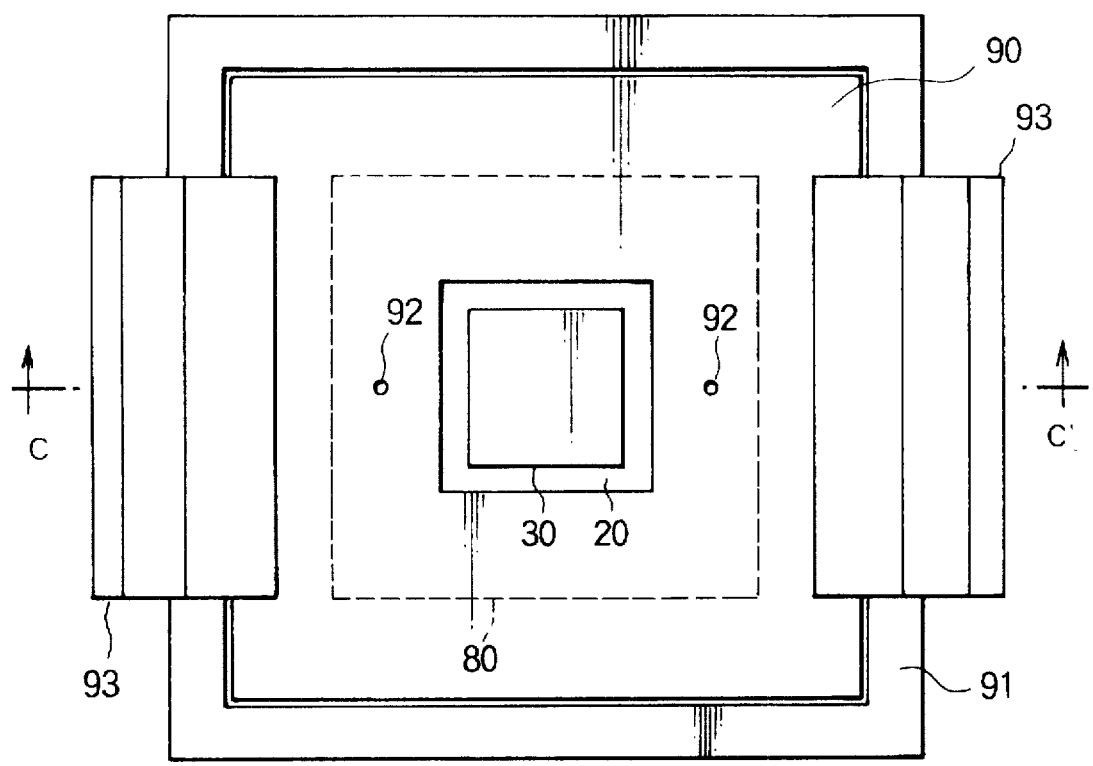
FIG. 14 is a plan view of a device for use in molding the semiconductor chip by resin material according to this invention.
Figure 15:
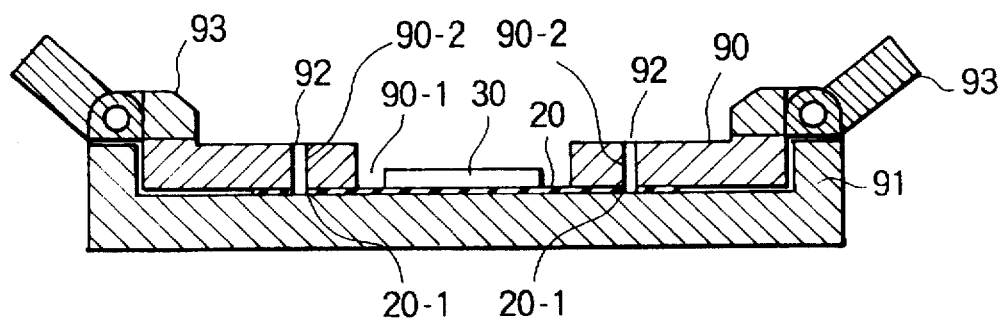
FIG. 15 is a sectional view taken along line C-C' in FIG. 14.

Referring to FIGS. 14 and 15, the description will proceed to a molding step of the semiconductor chip 30 according to the present invention. As mentioned in conjunction with FIG. 13, the semiconductor chip 30 has been bonded to the carrier tape 20. The molding step is carried out in the manner of a screen printing by the use of a metal mask 90. The metal mask 90 has a thickness which is a little more thicker than that of the semiconductor chip 30 and has an opening 90-1 which is narrower than the carrier tape 20 and which is capable of receiving the semiconductor chip 30. The metal mask 90 is held in a support table 91 having a rectangular recessed portion. A pair of positioning pins 92 are attached to a bottom surface of the recessed portion. The positioning pins 92 are symmetrical with respect to a center of the recessed portion. The carrier tape 20 has a pair of positioning holes 20-1 at positions which are correspond to the positioning pins 92. Similarly, the metal mask 90 has a pair of positioning holes 90-2 at positions which are correspond to the positioning pins 92. A pair of mask holders 93 are attached to both sides of the support table 91 in order to fix the metal mask 90 to the support table 91. The molding step of the semiconductor chip 30 is carried out in the following manner. At first, by inserting the positioning pins 92 into the positioning holes 20-1, the semiconductor chip 30 is set into the recessed portion in a state that the carrier tape 20 is close to the bottom surface of the recessed portion. The metal mask 90 is set into the recessed portion by inserting the positioning pins 92 into the positioning holes 90-2. Then, the metal mask 90 is fixed by the mask holders 93 to the support table 91. In this state, melt resin material is injected into the opening 90-1. The melt resin material brimmed over the opening 90-1 is scraped off by a squeegee (not shown). After solidification of the resin material, the metal mask 90 is removed from the support table 91. Thus, it is possible to obtain the semiconductor chip molded by the resin material. Hereinafter, the semiconductor chip molded by the resin material will be called a package hereinafter.

The metal mask 90 is made of, for example, stainless steel because it has superior release characteristic. It is desirable to prepare a plurality of metal masks which are different in thickness and in size of opening 90-1 according to the size of the semiconductor chip 30. The metal mask 90 is inexpensive because it is no need a complex shape that is illustrated in FIGS. 9 and 10. Since the semiconductor chip 30 is molded by the screen printing in a state that the carrier tape 20 is fixed by the mask holders 93, dispersion of thickness in the package can be improved. The semiconductor chip 30 can be molded in high accuracy because it is positioned precisely on the basis of the positioning pins 92.

Figure 16:
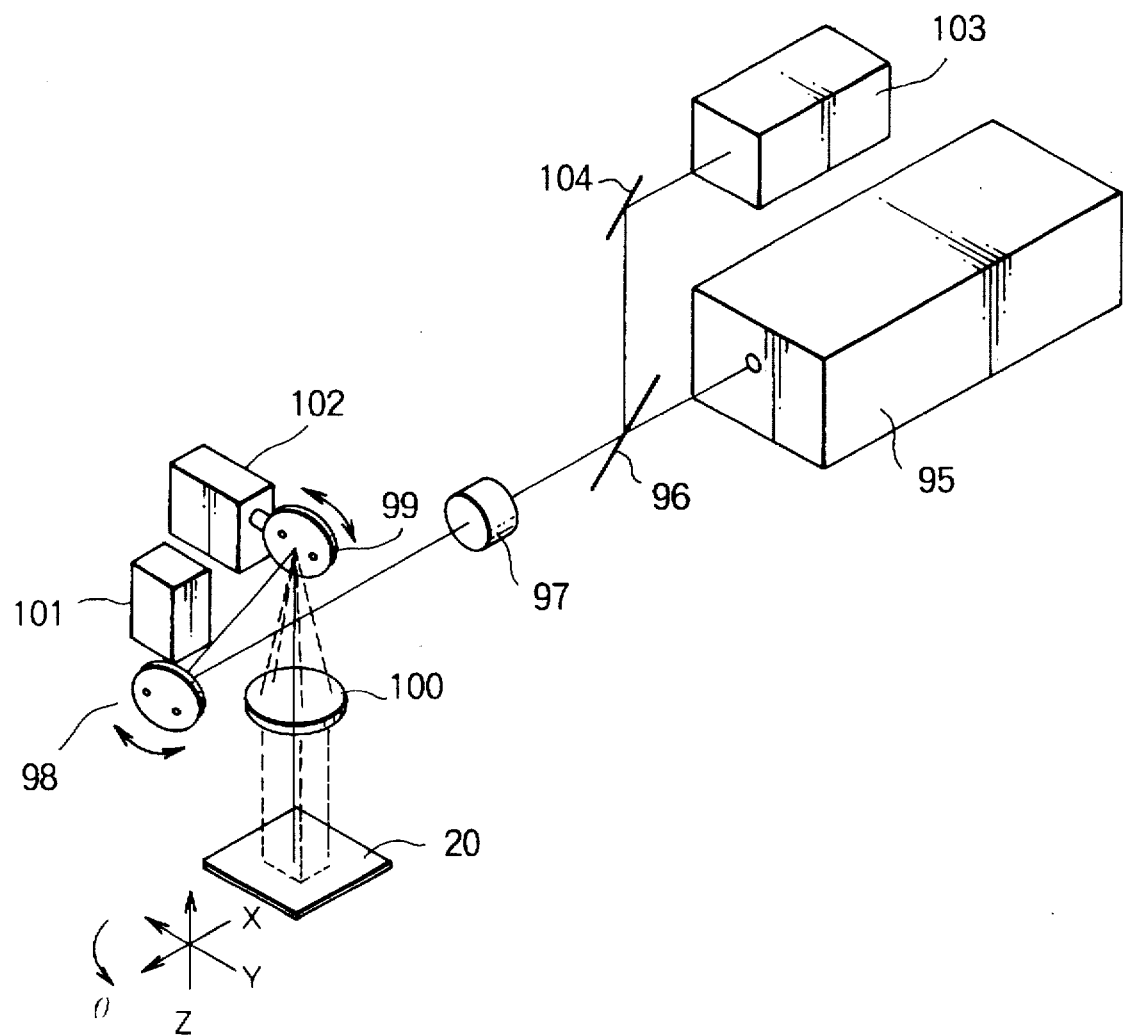
FIG. 16 is an illustration for explaining a device for cutting the carrier tape by a laser beam according to this invention.

Referring to FIG. 16, the description will proceed to the cutting step of the carrier tape 20. After the molding step, the carrier tape 20 is cut into the same size as the package. In the example, a YAG laser unit is used for the cutting step. The YAG laser unit comprises a YAG laser generating unit 95 for generating a laser beam. In particular, a fourth harmonic wave is used as the laser beam as will later be described in detail. The laser beam is projected through a dichroic mirror 96, an attenuator 97, a first galvano mirror 98, a second galvano mirror 99, and Fθ lens 100 to the carrier tape 20. The first galvano mirror 98 is for scanning the laser beam in an X-axis direction on the carrier tape 20 and is driven by a first drive unit 101. The second galvano mirror 99 is for scanning the laser beam in a Y-axis direction on the carrier tape 20 and is driven by a second drive unit 102. By combination of the first and the second galvano mirrors 98 and 99, the laser beam is projected to the carrier tape 20 so as to draw a square having the same size as the package. The size of the square is predetermined as a cutting size defined by a cutting line because the size of the package is known in advance. A CCD camera 103 is for carrying out the positioning of the carrier tape 20 by the use of a light path for the laser beam. For this purpose, a reflection mirror 104 is used. In addition, the carrier tape 20 integrated with the package is held by a hold table which will shortly be described.

Figure 17:
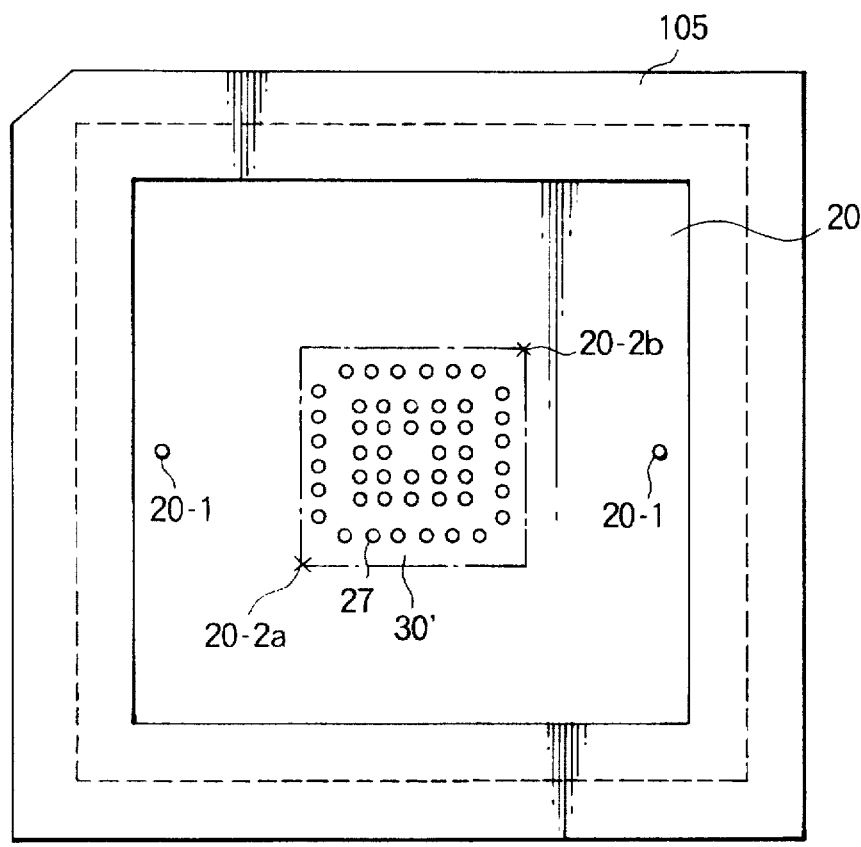
FIG. 17 is a plan view, seen from a side opposite to the semiconductor chip, of the carrier tape for explaining a determination process of a cutout line of the carrier tape.
Figure 18:
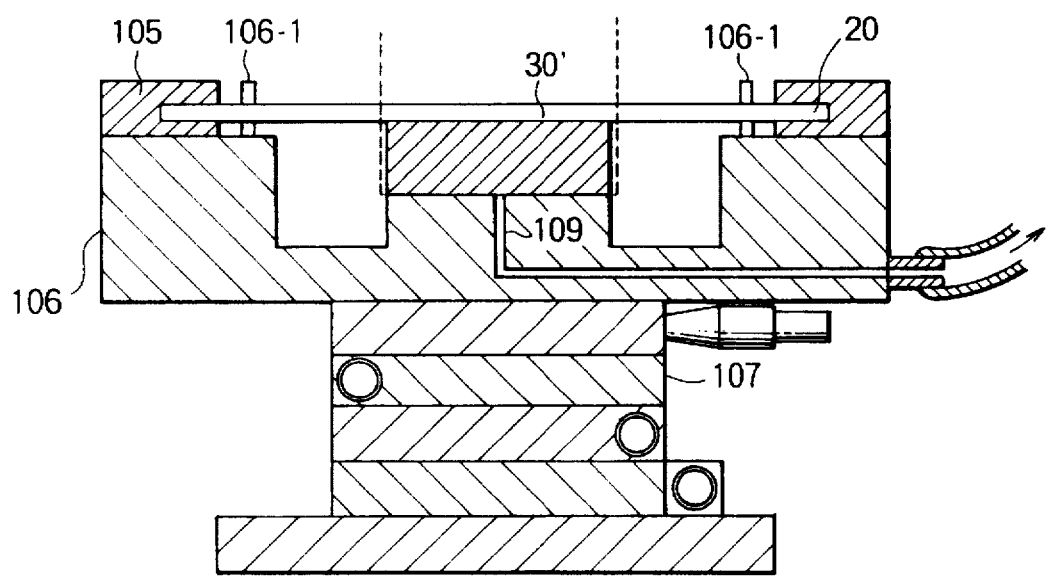
FIG. 18 is a sectional view of a device for use in cutting the carrier tape illustrated in FIG. 17.

Referring to FIGS. 17 and 18, the description will be made with regard to a manner for determining a cutting position of the carrier tape 20. In the example, the carrier tape 20 has two alignment marks 20-2a and 20-2b at the opposite side to the side of the wiring layer described in conjunction with FIGS. 4 and 5. The alignment marks 20-2a and 20-2b suffice for determining the cutting line of the square illustrated by a chain line. It is desirable that the alignment marks 20-2a and 20-2b locate at corners of the square.

In FIG. 18, the package is depicted at 30'. The carrier tape 20 is held by a carrier tape holder 105. The carrier tape holder 105 is set on a hold table 106. The hold table 106 is mounted on an X-Y-Z-θ table 107. The X-Y-Z-θ table 107 is movable in X-axis, Y-axis, and Z-axis directions, and is rotatable in a θ direction. In other words, the X-Y-Z-θ table 107 is horizontally rotatable. All of directions are illustrated in FIG. 16. Since such an X-Y-Z-θ table is well known in the art, a detailed description is omitted. Two positioning pins 106-1 are attached onto the hold table 106 for positioning the carrier tape 20 by the use of the positioning holes 20-1. Namely, the carrier tape holder 105 is set on the hold table 106 by inserting the positioning pins 106-1 into the positioning holes 20-1. In this state, the hold table 106 holds the package 30' by air chucking by the use of vacuum air through a through hole 109. An inlet side of the through hole 109 is connected to an air vacuum unit (not shown).

At first, by using the X-Y-Z-θ table 107, the carrier tape 20 is positioned at a predetermined area so that the carrier tape 20 comes into sight of the CCD camera 103. In order to determine a starting point of laser beam projection, the CCD camera 103 carries out a search operation of the alignment marks 20-2a and 20-2b in a manner of image processing well known in the art. When the alignment marks 20-2a and 20-2b are detected, one of the alignment marks 20-2a and 20-2b is determined as the starting point of the laser beam projection. Then, the laser beam is projected by the YAG laser unit so as to draw the cutting line which passes through the alignment marks 20-2a and 20-2b as illustrated in FIG. 17 by the chain line. Thus, the carrier tape 20 is cut into the same size as the package 30'.

According to another manner, a reference beam light is projected, at first, to the starting point of the laser beam projection. Then, the carrier tape 20 is positioned by the X-Y-Z-θ table 107 so that one of the alignment marks 20-2a and 20-2b coincides with a projection point of the reference beam light. Next, the reference beam light is projected to another projection point that another one of the alignment marks 20-2a and 20-2b must be positioned. Then, the carrier tape 20 is rotated by the X-Y-Z-θ table 101 so that other one of the alignment marks 20-2a and 20-2b coincides with the other projection point of the reference beam light. Next, the laser beam is projected by the YAG laser unit so as to draw the cutting line which passes through the alignment marks 20-2a and 20-2b. In the other manner, the image processing is used.

In the cutting step by the use of the YAG laser unit, the cutting size of the carrier tape 20 can be voluntarily changed because a rotation angle of the first and the second galvano mirrors 98 and 99 can be voluntarily adjusted. Since the cutting step is carried out by non-contact, the carrier tape 20 no receive mechanical stress.

Figure 19:
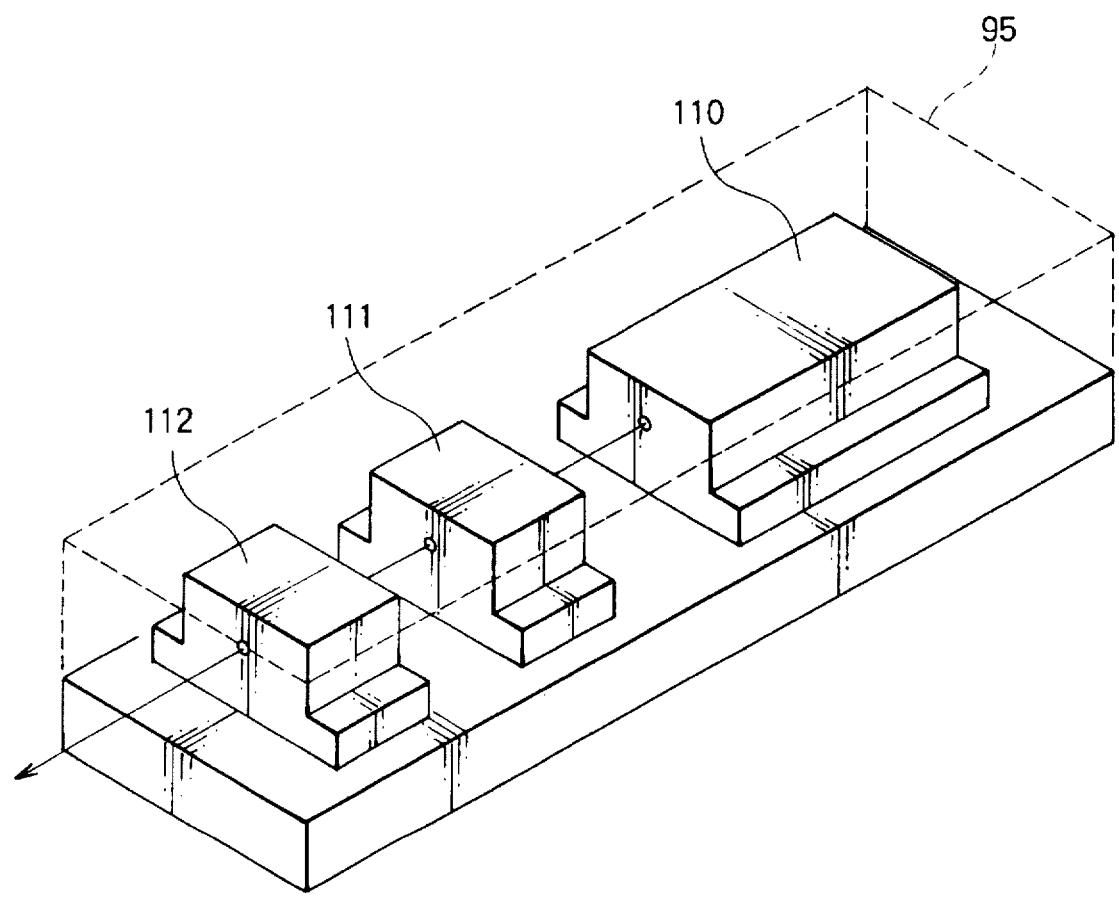
FIG. 19 shows a device for obtaining a fourth harmonic wave of a laser beam according to this invention.

Referring to FIG. 19, the YAG laser generating unit 95 comprises an YAG laser oscillator 110, a second harmonic generation element 111, and a fourth harmonic generation element 112 in order to generate the fourth harmonic wave mentioned in conjunction with FIG. 16. The YAG laser oscillator 110 generates a laser beam of a first stage having a wavelength of 1.06 ($\mu$m). The second harmonic generation element 111 receives the laser beam of the first stage and generates a laser beam of a second stage having a wavelength of 0.53 ($\mu$m). The fourth harmonic generation element 112 receives the laser beam of the second stage and generates a laser beam having a wavelength of 0.266 ($\mu$m). For example, the second harmonic generation element 111 is implemented by a KTP element while the fourth harmonic generation element 112 is implemented by a $\beta$ BBO element.

As the fourth harmonic wave of the laser beam, ultraviolet light having the wavelength of 0.266 ($\mu$m) is used. Such the ultraviolet light has a high absorption rate of laser energy and has a characteristic that a heating value in the carrier tape 20 is restrained. This is because diffusion of the energy caused by thermal conduction is restrained because the laser beam is projected in the form of a pulse wave. As a result, the carrier tape 20 has a reduced thermal stress.

What is claimed is:

1. A method of manufacturing a chip size semiconductor device comprising a semiconductor chip and a carrier tape including an insulating film and wiring patterns formed on one surface of said insulating film, said method comprising the steps of bonding said semiconductor chip and said carrier tape by the use of an adhesive film having a size corresponding to an adhesive area of said semiconductor chip, said adhesive film bonding said semiconductor chip and said carrier tape by heating, molding said semiconductor chip by resin material, and cutting unnecessary portion of said carrier tape, the step of bonding comprising the substeps of:

cutting away said adhesive film by punching from an adhesive film tape held above said semiconductor chip mounted on a table and subsequently setting said adhesive film on said adhesive area by moving said adhesive film downwardly.

2. A method of manufacturing a chip size semiconductor device as claimed in claim 1, wherein the substep of cutting is carried out by punching means, said punching means being movable upwardly and downwardly over the semiconductor chip mounted on said table and having vacuum chuck means for chucking said adhesive film by vacuum air, said punching means cutting away said adhesive film from said adhesive film tape and setting said adhesive film on said semiconductor chip by releasing from chucking after downward moving.

3. A method of manufacturing a chip size semiconductor device as claimed in claim 2, wherein said semiconductor chip is set on said table via a heat block provided with air holding means for holding said semiconductor chip by vacuum air and heating means for heating said adhesive film.

4. A method of manufacturing a chip size semiconductor device as claimed in claim 1, wherein the step of said molding comprises the substeps of:

positioning said semiconductor chip combined with said carrier tape at a position in a metal mask, said metal mask being capable of changing a size; and molding said semiconductor chip by the resin material in screen printing method.

5. A method of manufacturing a chip size semiconductor device as claimed in claim 4, wherein said metal mask has a thickness larger than a height size of said semiconductor chip and an opening which is narrower than said carrier tape in area and which is capable of containing said semiconductor chip, said metal mask being set on a support table, said semiconductor chip being set on said support table in said opening with said carrier tape come into contact with said support table.

6. A method of manufacturing a chip size semiconductor device as claimed in claim 1, said insulating film being provided with at least two alignment marks for determining a cutout line of said carrier tape, wherein the step of said cutting comprises the substeps of:

detecting said at least two alignment marks;

determining said cutout line on the basis of said alignment marks; and cutting said unnecessary portion of said carrier tape by scanning along with said cutout line a laser beam generated by a YAG laser.

7. A method of manufacturing a chip size semiconductor device as claimed in claim 6, wherein a fourth harmonic wave is used as said laser beam.

* * * * *